United States Patent [19]

Illenberger et al.

[11] 4,128,844

[45] Dec. 5, 1978

[54] CAMERA TUBE TARGET STRUCTURE EXHIBITING GREATER-THAN-UNITY AMPLIFICATION

[75] Inventors: Arno Illenberger; Gert Ruprecht; Klaus Berger, all of Berlin, Fed. Rep. of Germany

[73] Assignee: Robert Bosch GmbH, Stuttgart, Fed. Rep. of Germany

[21] Appl. No.: 836,856

[22] Filed: Sep. 26, 1977

Related U.S. Application Data

[63] Continuation-in-part of Ser. No. 599,545, Jul. 28, 1975, abandoned.

[30] Foreign Application Priority Data

Aug. 1, 1974 [DE] Fed. Rep. of Germany ....... 2436990

[51] Int. Cl.[2] .............................................. H01L 27/14

[52] U.S. Cl. ........................................ 357/31; 357/16; 357/63

[58] Field of Search .............................. 357/31, 16, 63

[56] References Cited

U.S. PATENT DOCUMENTS

| | | | |
|---|---|---|---|
| 3,755,002 | 8/1973 | Hirai | 148/1.5 |
| 3,800,194 | 3/1974 | Maruyama | 17/235 R |
| 3,900,882 | 8/1975 | Fukai | 357/30 |
| 4,007,473 | 2/1977 | Nonaka | 357/31 |

*Primary Examiner*—Martin H. Edlow
*Attorney, Agent, or Firm*—Michael J. Striker

[57] ABSTRACT

Proceeding in order from the light-side to the beam-side of the target structure, the structure includes a transparent glass plate, a transparent signal electrode, a photoconductive layer of n-type CdSe, and a layer of n-type ZnSe. The interface between the two n-type layers is possessed of a multitude of interface states capable of capturing holes optically liberated in the photoconductor and electrons injected by the scanning beam. Beam-injected electrons cannot pass directly across the interface, and therefore dark current is reduced in a manner as effective as with p-n junction target structures. Each optically generated hole trapped at the interface lowers the potential barrier for beam-injected trapped electrons by an amount such as to cause more than one such electron to enter the conduction band of the CdSe layer, resulting in greater-than-unity amplification. Amplification by factors in excess of 100 can be achieved.

12 Claims, 5 Drawing Figures

CAMERA TUBE TARGET STRUCTURE EXHIBITING GREATER-THAN-UNITY AMPLIFICATION

CROSS-REFERENCES TO RELATED APPLICATIONS

The present application is a continuation-in-part of our copending application Ser. No. 599,545, filed July 28, 1975 and entitled "PHOTO-CONDUCTIVE TARGETS FOR TELEVISION PICK-UP TUBES WITH NON-CONDUCTING JUNCTIONS".

BACKGROUND OF THE INVENTION

The present invention relates to target structures for television-camera pick-up tubes.

A well known problem in pick-up tube target structures concerns the minimization of dark current. The side of the target structure facing the scanning electron beam is charged by the latter to cathode potential. When image light is incident upon the other side of the target structure, the optically liberated charge carriers effect a discharge of the accumulated negative charge on the beam-side of the target, to an extent and with a geometry dependent upon the intensity and spatial composition of the image light. In the absence of incident light, it is of course necessary that the accumulated negative charge on the beam-side of the target structure, deposited there by the scanning beam, not be permitted to discharge. If the discharge of the accumulated negative charge occurs in the absence of incident light, then the resultant flow of dark current incorrectly simulates the incidence of non-existent scene light. Therefore, in the prior art, various expedients are known for ensuring that the discharge of the negative charge deposited on the target by the scanning electron beam occurs in dependence upon the number of charge carriers optically liberated by incident scene light, and not as a result of simple conductive current flow of beam-deposited negative charge carriers to the signal electrode of the target structure.

The most common of these prior-art techniques for minimizing dark current involve the use of p-n or blocking-layer junction structures. Thus, for example, in the case of plumbicon tubes, there is deposited on the front glass plate of the structure a transparent signal electrode, and deposited on the transparent signal electrode is a layer of n-type PbO followed by a layer of p-type PbO. The p-n PbO target structure acts as a diode, and is maintained reverse-biased by the operating voltage of the pickup tube. When the scanning electron beam deposits negative charge carriers on the beam-side of the p-n structure, these negative carriers cannot cross the reverse-biased p-n junction, except to a very small extent corresponding to the reverse-bias current flow through the diode structure; accordingly, dark current (discharge of the accumulated negative charge in the absence of incident scene light) is minimized. In contrast, when scene light is incident upon the target structure, the charge carriers optically liberated within the photoconductive material of the target can cross the reverse-biased p-n junction (i.e., from the n to the p side thereof) and effect dicharge of the beam-deposited electrons.

The establishment of such a p-n diode junction in the PbO of a pumbicon target structure involves only the appropriate p- and n-doping of the PbO, inasmuch as PbO is amphoteric. Where the photoconductive material of the target structure is not amphoteric, the requisite p-n diode junction is formed from two different materials, i.e., a heterocontact. For example, CdSe is a most preferred photoconductor for pick-up tube target structures, because of its excellent spectral response and sensitivity and because it is not damaged by exposure to very bright scene light. However, CdSe is not amphoteric, and can only be doped to be of n-type, not p-type. Therefore, in order to create the p-n junction requisite for minimization of dark current, the n-type CdSe layer of the target is covered by a layer of p-type material, such as p-type CdTe, or the like. The resultant p-n heterocontact minimizes dark current in substantially the same way as the p-n layer of amphoteric PbO in a plumbicon tube.

The use of p-n junctions does minimize dark current, and is therefore successful in that sense. However, pick-up tube target structures using p-n junctions inherently tend to have a lower sensitivity than, for example, comparable target structures making use of essentially a single homogeneous layer of CdSe. The amplification which can be achieved using known p-n junction target structures is generally considerably less than unity, and greater-than-unity amplification (i.e., true gain) has been heretofore impossible. The maximum theoretical amplification in p-n junction target structures is limited to unity. I.e., if each incident scene light quant is absorbed by the photoconductive layer of the target structure and optically generates one electron-hole pair, and if the optical generation of each electron-hole pair results in the discharge of one beam-deposited electron on the beam-side of the target structure, then each incident light quant discharges one beam-deposited electron, and the amplification would be unity. Unity amplification has been conceived of as the inherent limit of amplification in p-n junction target structures of the type in question, because the mechanism which the prior art establishes in such target structures for the discharge of beam-deposited electrons is based upon discharge by primary photocurrent, i.e., discharge by recombination with optically liberated charge carriers. Of course, in reality, the value of the amplification in p-n junction target structures is considerably less than unity.

Greater-than-unity amplification (gain) would result if, somehow, each incident light quant, and therefore each electron-hole pair generated by the incident light quant, could effect the removal of more than one of the beam-deposited electrons accumulated at the beam-side of the target structure.

Greater-than-unity amplification (gain) can be achieved in, for example, vidicon target structures not employing a p-n junction. In such a vidicon target structure, of each electron-hole pair generated by an absorbed light quant, the hole is trapped within the photoconductive layer of the target, whereas the electron quickly travels to the anode. The resultant loss of electrical neutrality must be compensated by introduction of replenishing electrons into the photoconductive layer. However, the beam-deposited electrons accumulated on the beam-side of the target structure cannot themselves effect this replenishment and restoration of electrical neutrality. Instead, restoration of electrical neutrality is effected by electrons coming directly out of the scanning beam itself. Thus, reestablishment of electrical neutrality within any single picture element of the target structure can only be achieved during the short time interval that the scanning electron beam is actually incident upon this picture element to inject electrons which recombine with the trapped holes. Thus, two counteracting effects are involved: one, the continual generation of such trapped holes during scene light incidence; and two, the injection of electrons directly from the scanning beam which then recombine with the trapped holes, to restore electrical neutrality. The equilibrium between these two processes is established only slowly. During operation, there may at any one time be a greater number of thusly trapped optically generated holes than can be generated during a single image period. As a result, during a single image period, the number of beam-injected electrons introduced into the photoconductive layer may be greater than the number of holes optically generated during that particular image period. This is often referred to in the art as "stack gain". In this situation, the reproduced image derived from the T.V. camera tube will form only gradually and likewise will disappear only gradually. Of course, this sluggishness of response is completely unacceptable for most practical applications, even though in a certain sense greater-than-unity amplification (gain), i.e., within certain image periods, may have been acheived.

Greater-than-unity amplification (gain) can also be achieved in CdSe photocells, if they are provided with gold blocking contacts. In this case, the electrodes form Schottky junctions, as a result of the high work function of the gold. Diffusion of electrons into the CdSe is prevented by a potential barrier which cannot be overcome by thermal excitation alone. However, its effect is reduced with increasing field strength due to tunneling effects resulting in an increase in current, expoentially dependent upon the square root of the applied voltage. Additionally, when light is incident, there is a further increase in charge carrier injection at the junction, caused by an increase in the (positive) space charge density in the surface layer of the photoconductor, even at low levels of illumination. Although greater-than-unity amplification (gain) is achieved in this way, the use of gold blocking junctions is not applicable to camera tube target structures, because the use of metal layers at the beam-side of the target is impermissible. The layer upon which the beam-deposited electrons accumulate must be of high resistivity (greater than $10^8$ ohm-centimeters), in order to prevent the loss of image resolution which would occur if the non-uniform accumulation of beam-deposited electrons on the beam-side of the target could equalize itself by electron travel in the direction parallel to the target surface. Accordingly, the gold blocking layers referred to above cannot be used.

Finally, it is known in the art to increase the sensitivity of a p-n junction target structure (wherein for example the n-layer is CdSe and the p-layer is Se mixed with As and Te) by subjecting the n-layer to oxidation prior to deposition of the p-layer thereon. A meaningful increase of sensitivity results, for reasons which hitherto have not been understood, but in any event greater-than-unity amplification (gain) is not even approached.

SUMMARY OF THE INVENTION

It is a general object of the invention to provide a novel target structure for T.V. camera pick-up tubes, wherein dark current is minimized somewhat in the manner of the p-n junctions conventional in the prior art, but which at the same time is capable of producing greater-than-unity amplification (gain).

Our work in this area began with investigation of a surprising phenomenon, namely the ability of an n-n junction target structure to counteract dark current in a way similar to that in which conventional p-n junction target structures can, i.e., even though both photoconductive layers are of n-type material and no actual p-n junction is formed. As a result of theoretical insights which we have developed, we have found it to be possible, using n-n junction target structures, not only to counteract dark current in the manner of a p-n junction, but furthermore to create greater-than-unity amplification (gain). Thus, at a first level, the invention relates to novel n-n junction target structures.

As a result of our newly won theoretical understanding of this possibility (greater-than-unity amplification in an n-n junction target structure), we have also discovered that a p-p junction target structure can be made to first counteract dark current in the manner of a p-n junction target and, second, likewise provide greater-than-unity amplification.

When we fully developed our theoretical model for the electronic mechanisms involved in our n-n and p-p target structures, we came to a still further, and equally surprising discovery. Not only did we find that the photoconductive layer of the junction can be either of p-type or n-type, but additionally that the other semiconductor layer of the junction likewise can be of either p-type or n-type, and can even be a simple insulator. Nevertheless, the resultant target structure can still be made to counteract dark current in the manner of prior-art p-n junction target structures, and greater-than-unity amplification (gain) can be acheived.

Specifically, we have found that the creation of interface states between the two layers in question can be made to produce a potential barrier for beam-injected electrons (or alternatively for anode-injected holes), with the level of this barrier being controlled by the optically generated charge carriers. Thus, in the present invention, the primary photocurrent constituted by optically generated charge carriers does not, in itself, effect discharge of beam-deposited electrons at the beam-side of the target structure. Instead, this primary photocurrent controls the height of a potential barrier for a secondary current of greater magnitude. As explained in detail further below, each charge carrier generated by an incident light quant is used to lower the potential barrier for secondary-current charge carriers to such an extent that more than one secondary-current charge carrier can cross the interface region in response thereto. Thus, each absorbed light quant contributes, indirectly, more than one charge carrier to the flow of secondary current, and greater-than-unity amplification (gain) is achieved. The overall action, i.e., a primary photocurrent controlling the height of a potential barrier for a secondary current of greater magnitude, is something like that of a phototransistor. Accordingly, in contrast to the p-n junction targets of the prior art, which can be referred to as diode target structures, what the present invention provides can be reasonably described as a phototransistor target structure.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 3:
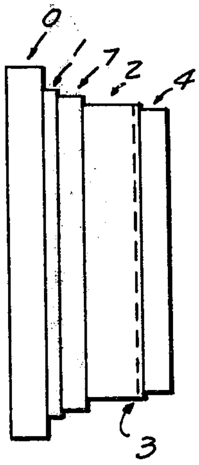
FIG. 3 illustrates the successive layers of the target structure.

FIG. 3 is referred to first, to give a brief overview of the successive layers of the inventive target structure. A flat glass substrate O carries a transparent signal electrode 1. Deposited on the signal electrode 1 is a first layer 2 which is of photoconductive material. Between the layers 1 and 2 there is formed a contact which is blocking for holes, i.e., even when scene light is incident; the formation of this hole-blocking contact is known in the art, and need not be explained in detail here. Predeposited on the layer 1 is a layer 7 of material which serves to increase the blue-sensitivity of the target structure; although this function is very important in a practical sense, the provision of layer 7 is not directly involved in the achievement of greater-than-unity amplification, and layer 7 will accordingly be discussed later on. Formed on the beam-side (right side in FIG. 3) of the layer 2 is a region 3 with a high density of impurities providing a multitude of interface states capable of capturing charge carriers. Finally, deposited over region 3 is a second layer 4 of high-resistivity material. High resistivity in the context in question means a resistivity in excess of $10^8$ ohm-centimeters; this high resistivity is required to prevent the image-resolution loss which could result from equalization of accumulated charge carriers in directions parallel to the general plane of the target structure.

Figure 1:
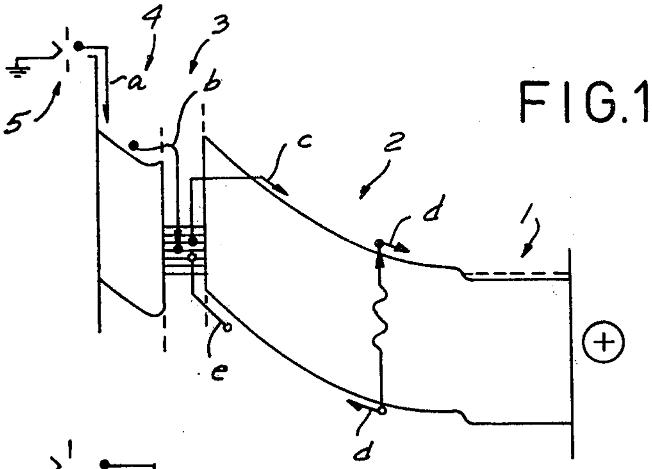
FIG. 1 is a band-structure diagram for an embodiment of the invention employing an n-n junction for the target structure.

Reference is now made to the band-structure diagram of FIG. 1. FIG. 1 depicts the band situation for an embodiment of the invention in which the layers 2 and 4 are both n-type semiconductors, and in which the region 3 providing the multitude of interface states which trap electrons and holes is provided in the form of a region with a high density of acceptor-type impurities, i.e., the interface states are predominantly acceptor-level states. Examples of appropriate materials and production procedures are discussed further below.

First, the relationships of the energies of the edges of the valence and conduction bands to either side of the interface-states region 3 should be noted. The conduction band of n-type layer 2 has a higher edge energy at the light-side of interface region 3 than does the conduction band of n-type layer 4 at the beam-side of the interface region 3. Indeed, the energy of the conduction band of n-type layer 2, just to the light-side of the interface region 3, has a spike. Furthermore, the edge energy of the valence band of n-type layer 4 at the beam-side of the interface region 3 is lower than the edge energy of the valence band of n-type layer 2 at the lightside of the interface region 3. The importance of these band-structure relationships will become clearer below.

The operation is as follows:

The electron beam 5 injects electrons (shown as filled-in dots) at a into the high-resistivity n-type layer 4.

The thusly injected electrons acquire thermal energy and flow, in the form of a space-charge-limited current, towards the interface region 3.

When the injected electrons reach the interface region 3, they cannot cross the interface region directly. Instead, they are captured in the interface states at region 3, as shown at b.

The injected electrons continue to become trapped, in this way, in the interface-states region 3, until the surface of n-type layer 2 has charged up almost to cathode potential.

The interface traps for these electrons, in combination with the spike in the conduction band of n-type layer 2 to the right of the interface region 3, hinders escape of the trapped electrons from the interface-states region 3. However, due to thermal emission, supplemented by tunneling effects, a certain number of the electrons trapped in interface region 3 do escape, as shown at c, and this very limited number of escaping electrons forms the dark current of the target structure. This dark current is of acceptably low magnitude; numerical values are presented further below.

Now, when scene light is incident (from the right in FIG. 1) upon n-type photoconductive layer 2, an absorbed light quant optically generates one electronhole pair, as shown at d. The flow of thusly generated charge carriers constitutes the primary photocurrent of the device.

The optically liberated hole (shown as an empty dot) flows towards the interface-states region 3, where it too becomes trapped in the interface states, as shown at e. It is to be noted that these holes cannot directly cross the interface region 3 (i.e., right to left in FIG. 1) because the edge energy of the valence band at the beam-side of the interface region 3 is lower than at the light-side of the interface region. Thus, the optically generated holes become trapped in the interface-states region 3, and positive charge accumulates at this region. Each trapped hole stays trapped until it either combines with an electron in the interface region 3, or else until thermal emission causes it to enter into the valence band of n-type semiconductor layer 4.

This entrapment of holes at interface region 3, this recombination of trapped holes with electrons at the interface region, and this thermal emission of trapped holes from interface region 3 into the valence band of layer 4 are all in equilibrium with one another. In the presence of steady illumination, therefore, there will always be a certain number of positive charges in the interface region 3.

This increase in the positive charge captured in interface region 3 in response to light incidence tends to upset electrical neutrality. Because the operating voltage employed is constant, and because the capacitance of the target structure is likewise constant, the tendency to lose electrical neutrality can only be counteracted by replenishment with electrons.

Accordingly, to counteract the tendency to lose electrical neutrality, still more electrons flow toward the interface region 3 and become trapped in the interface states.

As more and more electrons become trapped in the interface-states region 3, interface states of higher and higher energy levels are becoming filled by the electrons. Thus, as more and more electrons become trapped in the interface region 3, the added energy which the highest-energy trapped electrons need to escape into the conduction band of n-type layer 2 decreases correspondingly. Therefore, the greater the number of trapped electrons, the greater in the probability that the highest-energy trapped electrons can escape into the conduction band of layer 2.

Thus, if the incident light becomes more intense, the number of optically generated holes increases, the number of holes which become trapped at interface region 3 increases correspondingly, and the effective value of the potential barrier for electrons at the interface region 3 becomes lower and lower. Each lowering of the potential barrier for electrons results in a greater flow of electrons into the conduction band of n-type layer 2, and this flow of electrons from the interface region 3 into the layer 2 constitutes the secondary current of the target — i.e., in contrast to the primary photocurrent constituted by the flow of electrons and holes optically generated within layer 2.

Each hole generated in layer 2 by an absorbed light quant causes, on the average, more than one electron to cross the interface region 3 into the layer 2. This constitutes greater-than-unity amplification (gain), which could not be achieved in the prior art in any comparable context. As considerably fewer charge carriers are sufficient to effect such a change in barrier level than are required to effect a similar variation in the space charge zone in the semiconductor, this type of controlled injection possesses a higher speed of response to light changes. We have constructed working targets exhibiting gains in excess of 100.

In describing the electronic operation of the inventive target structure with respect to the band diagram of FIG. 1, it has been assumed that both the layer 2 and the layer 4 are of n-type material (exemplary materials are discussed further below). Evidently, this use of an n-n junction target structure, capable of minimizing dark current in substantially the same way as the p-n junction target structures of the prior art, stands in remarkable contrast to the p-n junction targets of the prior art.

However, continued investigation has revealed that the layer 4 (in the embodiment of FIG. 1) need not actually be of n-type material, and could just as well be of p-type material, or even of insulating material. In particular, because the layer 4 will in general be only one or a few hundred nanometers thick and will have very few electron traps, it presents hardly any resistance at all to the travel of electrons from the beam-side of the target structure to the interface region 3. Even if a Schottky barrier should happen to be present in layer 4, such a barrier is forward-biased and scarcely hinders the flow of electrons, at all. Accordingly, in the embodiment of FIG. 1, whether the layer 4 is of n-type, p-type or of insulating material proves in the end to have no direct significance for the travel of beam-side electrons into the interface region 3. For any of these possibilities, so long as the interface states at region 3 are provided predominantly by means of acceptor-type impurities, the band-structure and electronic-operation diagram of FIG. 1 is applicable; i.e., the control of a larger secondary current consisting of electrons by a means of a smaller primary photocurrent, and in particular the trapped optically generated holes thereof, develops. Evidently, this is most surprising and unexpected.

Furtheremore, in addition to the possibilities for layer 4 just explained, it is also possible to replace the n-type layer 2 with a layer of p-type photoconductive material. This may be desired, for example, for reasons of design when another material for layer 2 has a spectral sensitivity closer to what is desired for a particular application. So long as the interface states at region 3 are provided predominantly by means of acceptor-type impurities, the band-structure and electronic-operation diagram of FIG. 1 is still applicable.

For all these various possibilities, what is important is the following: that the interface states at region 3 be provided predominantly by acceptor-type impurities, that the edge energy of the conduction band of layer 2 to the light-side of the interface be higher than that of layer 4 at the beam-side of the interface and preferably have the illustrated spike, and that the edge energy of the valence band of layer 4 be lower at the beam-side of the interface than that of layer 2 at the light-side of the interface. The first two requirements in conjunction assure that beam-injected electrons cannot pass directly across the interface but instead become trapped in the interface states; the first and third requirements in conjunction assure that optically liberated holes cannot pass directly across the interface but instead become trapped in the interface states. Persons skilled in the art will appreciate that the heterojunction of FIG. 1 corresponds somewhat to two mutually opposed Schottky junctions connected together via the boundary surface layer.

In the embodiments discussed with respect to FIG. 1, the flow of a secondary current constituted by beam-injected electrons is controlled by entrapment of the optically generated holes of the primary photocurrent, because the interface states at region 3 are provided predominantly by means of acceptor-type impurities. This is presently the preferred approach. However, as will be explained with reference to FIG. 2, reversal of all relationships likewise results in an operative target structure in which dark current is minimized in the manner of prior-art p-n junction targets, and in which furthermore greater-than-unity amplification (gain) is achieved.

Figure 2:
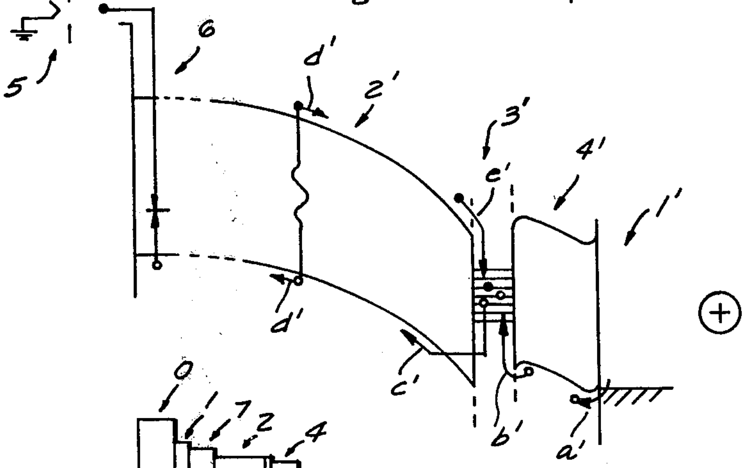
FIG. 2 is a diagram like that of FIG. 1, for an embodiment employing a p-p junction for the target structure.

In FIG. 2, the interface states at region 3' are provided predominantly by means of donor-type impurities. The sequence of layers is reversed relative to that for the FIG. 1 embodiments. Specifically, in the FIG. 2 embodiments, the transparent signal electrode 1' is adjoined by a p-type semiconductor layer 4', corresponding in its purpose to layer 4 in the FIG. 1 embodiments. The photoconductive layer 2' is located at the beamside of the interface region 3', not at the light-side as in the FIG. 1 embodiments. Also, for reasons explained below, an additional layer 6 is provided at the beamside of photoconductive layer 2' and is operative for preventing beam-injected electrons from reaching the interface region 3'.

In the FIG. 2 embodiments, the edge energy of the valence band of layer 2' at the beam-side of the interface region 3' is lower than that of the valence band of layer 4' at the light-side of the interface region and will in general have the illustrated downward spike; this is analogous to the relationship between the conduction bands of layers 2 and 4 in the FIG. 1 embodiments. The edge energy of the conduction band of layer 4' at the light-side of the interface region 3' is higher than that of the conduction band of layer 2' at the beam-side of the interface region; that is analogous to the relationship between the valance bands of layers 2 and 4 in the FIG. 1 embodiments.

The electronic operation of the FIG. 2 embodiments is as follows:

The signal electrode 1' injects holes (shown as empty dots) into the p-type layer 4', as shown at a'.

The thusly injected holes acquire thermal energy and flow, in the form of a space-charge-limited current, towards the interface region 3'.

When the injected holes reach the interface region 3', they cannot cross the interface region directly. Instead, they are captured in the interface states, as shown at b'.

The injected holes continue to become trapped, in this way, in the interface-states region 3', until the surface of p-type layer 2' has charged up almost to anode potential.

The interface traps for these holes, in conjunction with the spike in the valence band of p-type layer 2' to the left of the interface region 3', hinders escape of the trapped holes from the interface-states region 3'. However, due to thermal emission, supplemented by tunneling effects, a certain number of the holes trapped in interface region 3' do escape, as shown at c'. This limited number of escaping holes can travel towards the beam-side of the target structure and combine with beam-injected electrons, resulting in a dark current. The dark current is of acceptably low magnitude.

Now, when scene light is incident (from the right in FIG. 2) upon p-type photoconductive layer 2', an absorbed light quant generates one electron-hole pair, as shown at d'. The flow of thusly generated charge carriers constitutes the primary photocurrent of the device.

The optically liberated electron (shown as a filled-in dot) flows towards the interface-states region 3', where it too becomes trapped in the interface states, as shown at e'. It is to be noted that these electrons cannot directly cross the interface region 3' (i.e., left to right in FIG. 2) because the edge energy of the conduction band at the light-side of the interface region 3' is higher than at the beam-side of the interface region, thereby contributing to the entrapment of electrons at e'.

Thus, the optically generated electrons become trapped in the interface-states region 3', and negative charge accumulates at this region. Each trapped electron stays trapped until it either combines with a hole at the interface region 3', or else until thermal emission causes it to enter into the conduction band of p-type semiconductor layer 4'.

This entrapment of electrons at interface region 3', this recombination of trapped electrons with holes at the interface region, and this thermal emission of trapped electrons from interface region 3' into the conduction band of layer 4' are all in equilibrium with one another. In the presence of steady illumination, therefore, there will always be a certain number of negative charges in the interface region 3'.

This increase in negative charge captured in interface region 3' (i.e., relative to the dark state) tends to upset electrical neutrality. Because the operating voltage employed is constant, and because the capacitance of the target structure is likewise constant, the tendency to lose electrical neutrality can only be counteracted by replenishment with holes.

Accordingly, to counteract the tendency to lose electrical neutrality, still more holes flow toward the interface region 3' and become trapped in the interface states.

As more and more holes becomes trapped in the interface-states region 3', interface states of lower and lower enegy levels are becoming filled by the holes. Thus, as more and more holes become trapped in the interface region 3', the change of energy which the lower-energy trapped holes need to escape into the valence band of p-type layer 2' decreases correspondingly. Therefore, the greater the number of trapped holes, the greater is the probability that the lowest-energy trapped holes can escape into the conduction band of layer 2.

Thus, if the incident light becomes more intense, the number of optically generated electrons increases, the number of optically generated electrons which become trapped at interface region 3' increases correspondingly, and the effective value of the potential barrier for holes at the interface region 3' becomes less and less. Each lowering of the potential barrier for holes results in a greater flow of holes from the interface region 3' into the layer 2'. This flow of holes from interface region 3' into the layer 2' can be equated with the secondary current of the target (i.e., ignoring for simplicity the darkcurrent component thereof) and stands in contrast to the primary photocurrent constituted by the flow of electrons and holes optically generated within layer 2'.

This much of the description of the electronic operation of the FIG. 2 embodiments has been formulated analogous to that for the FIG. 1 embodiments, to bring out the similarities in the mechanism. However, there are certain differences between the mechanisms of FIGS. 1 and 2.

In the FIG. 2 embodiments, when the secondary-current holes enter into the valence band of layer 2' at c', they travel toward the layer 6 at the beam-side of the target structure and there recombine with beaminjected electrons, thereby effecting image-dependent discharge of the electrons at the beam-side of the target structure. The purpose of layer 6 is to form with layer 2' a junction which is blocking for rightwards travelling electrons, but non-blocking for leftward travelling holes.

This electron-blocking junction is necessary to prevent beam-injected electrons from reaching the interface region 3'. Inasmuch as the potential barrier for holes at region 3' is controlled by the number of electrons trapped at region 3', it is necessary that the barrier-controlling electrons trapped at 3' be optically generated electrons from layer 2 — i.e., so that the potential barrier for holes at 3' will be controlled substantially exclusively in dependence upon incident light, and not be improperly lowered by electrons which are merely coming from the beam-side of the target structure.

In the FIG. 2 embodiment, for the same reasons as explained with respect to the FIG. 1 embodiments, the photoconductive layer 2' can be n-type just as well as p-type, and the semiconductor layer 4' can be n-type just as well as p-type or can even be of insulating material — i.e., provided that the energy-band relationship illustrated and discussed above are met.

If the photoconductive layer 2' is of n-type material, then the layer 6 can simply be of p-type material, i.e., to form a simple p-n junction of the type used in the prior art to minimize dark current but used here to prevent beam-injected electrons from controlling the potential barrier for holes at region 3'. If the photoconductive layer 2' is of p-type material, then layer 6 could for example be of p-type material also. I.e., one could establish a junction between layers 6 and 2' like the p-p junction described earlier with reference to FIG. 1. However, whereas the p-p junction described with reference to FIG. 1 has a hole-controlled potential barrier for electrons, this in general should be avoided for the junction between layers 6 and 2' in FIG. 2, because the resulting amplification would not in itself contribute to the operative gain of the target structure but instead could produce undesirable feedback effects. If a p-p type junction such as described with respect to FIG. 1 is used for the 6, 2' junction of FIG. 2, then, to avoid amplification, the edge energy of the valence band at the left of the junction should not be lower than at the right of junction (i.e., it should not be as shown in FIG. 1), so as not to contribute to capture of holes.

The method of producing the novel target structures is technologically very simple. For the n-n junction target structure described with reference to FIG. 1, the preferred material for layer 2 is n-type CdSe, because of its inherently high sensitivity.

The transparent signal electrode 1 is deposited onto a flat glass substrate 0. Deposited onto the transparent signal electrode 1 is the preferred n-type CdSe photoconductive layer 2. As explained earlier, it is necessary that the signal electrode 1 and photoconductive layer 2 form a junction which is non-conductive for holes. This requirement is met if the transparent signal electrode 1 is an $SnO_2$ layer (NESA layer). The photoconductive layer 2 is deposited on the signal electrode 1 by ordinary vapor deposition, but in vacuum of approximately $10^{-6}$ Torr and to a thickness of approximately 1–3 microns. To improve the stoichiometry and crystal structure of the layer 2, it is advantageous to maintain the substrate at a temperature of about 180° C. to 400° C. during the vapor-deposition process. The thusly formed photoconductive layer is then subjected to recrystallization. The recrystallization can be effected by means of heat treatment, for example for a duration of 10–30 minutes at a temperature of 350° C. to 550° C. in a nitrogen atmosphere. However, to accelerate the recrystallization process and to reduce the requisite temperature, copper-(I)-chloride can be added to the CdSe vapor atmosphere, mixed therewith in a ratio of for example 3:10 by weight and brought into contact with the part of the target structure thus far formed in the reaction chamber. Additionally, this after-treatment inherently results in doping of the photoconductive layer causing an increase in the sensitivity of the photoconductive layer, in a manner known in the art.

Before vapor depositing the cover layer 4 onto the photoconductive layer 2, surface trapping centers are formed on the layer 2, for the establishment of the desired interface-states region 3. It is known that surface trapping centers can be formed on the surface of samples of II-VI compounds by absorption of oxygen. It is sufficient, therefore, to expose the photoconductive layer 2, after recrystallization, to a gas containing oxygen, for example air. Intensified formation of these surface trapping centers can be achieved during the recrystallization process, by introducing into the reaction chamber a small proportion of oxygen, e.g., on the order of a few percent. The surface trapping centers can also be formed in a separate aftertreatment, by exposing the photoconductive layer 2 to an oxygen-containing gas at temperatures of about 250° C. to 500° C.

Next, the n-type layer 4 is deposited onto the n-type photoconductive layer 2. The preferred material for an n-type cover layer 4 is ZnSe. The deposition of layer 4 on layer 2 is effected by vapor deposition in a vacuum. During the deposition, excessive thermal loading of the photoconductive layer 2 must be avoided, in order to avoid destruction of the surface trapping centers just created for the interface region 3. With the preferred use of n-type CdSe for photoconductive layer 2 and n-type ZnSe for semiconductor layer 4, the important band relationships depicted in FIG. 1 will be created. I.e., the edge energy of the valence band (electron affinity plus band gap) of the n-type ZnSe layer 4 at the beam-side of the interface region 3 will be lower than that of the valence band of the n-type CdSe layer 2 at the light-side of the interface region 3, just as shown in FIG. 1; likewise, the edge energy of the conduction band of the n-type CdSe layer 2 at the light-side of interface region 3 will be higher than that of the conduction band of the n-type ZnSe layer 4 at the beam-side of the interface region and will have an upward spike, just as shown in FIG. 1. As a result, it is assured that the holes optically generated within CdSe layer 2 and flowing toward interface region 3 are captured there, held there and contribute to the control of the potential barrier for beam-injected electrons, i.e., because the capture area of the trapping centers 3 might not be sufficient in itself to hold the optically generated holes. Although the n-type ZnSe/n-type CdSe combination is presently preferred, the n-type ZnSe layer could be replaced by other semiconductor materials such as zinc sulfide, arsenic trisulphide, antimony trisulfide; also, as explained earlier, the n-type layer 4 of FIG. 1 can be replaced by insulating material, of which examples whose operativeness has been confirmed by experimentation include calcium fluoride, magnesium fluoride and silicon oxide. In other words, layer 4 will be a high-resistivity non-metallic material. Layer 4 can have a thickness on the order of a few hundred nanometers. At present, the embodiments whose band relationships are depicted in FIG. 1 (control of potential barrier for beam-injected electrons by means of entrapment of optically generated holes in the interface region) are preferred relative to the embodiments whose band relationships are depicted in FIG. 2 (control of potential barrier for anode-injected holes by means of entrapment of optically generated electrons in the interface region), because of the greater simplicity of the FIG. 1 embodiments.

Figure 4:
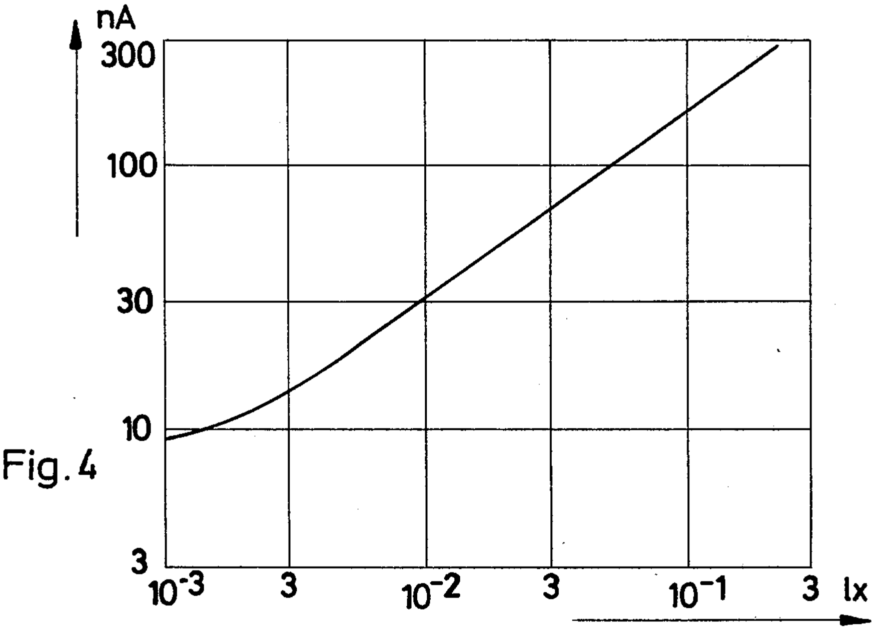
FIG. 4 is a graph depicting the dependence of the signal current upon the intensity of light incident on the target structure.

The unprecedented sensitivity of the inventive greater-than-unity-amplification target structures can be appreciated from a consideration of the current versus illumination graph of FIG. 4, plotted for a tested n-ZnSe/n-CdSe target structure of the type whose band structure is shown in FIG. 1. For an illumination as low as 0.1 lux, the signal current of the device is already as high as 100–300 nanoamperes. If the target is exposed to illumination on the order of 10 luxes, the signal current rises to a value on the order of magnitude of 10,000 nanoamperes. Evidently, this is without precedent in the prior art. As indicated earlier, whereas prior-art p-n or blocking junction target structures have not been capable of greater-than-unity amplification (gain), we have produced target structures wherein the gain has been measured to be in excess of 100, and even higher.

Figure 5:
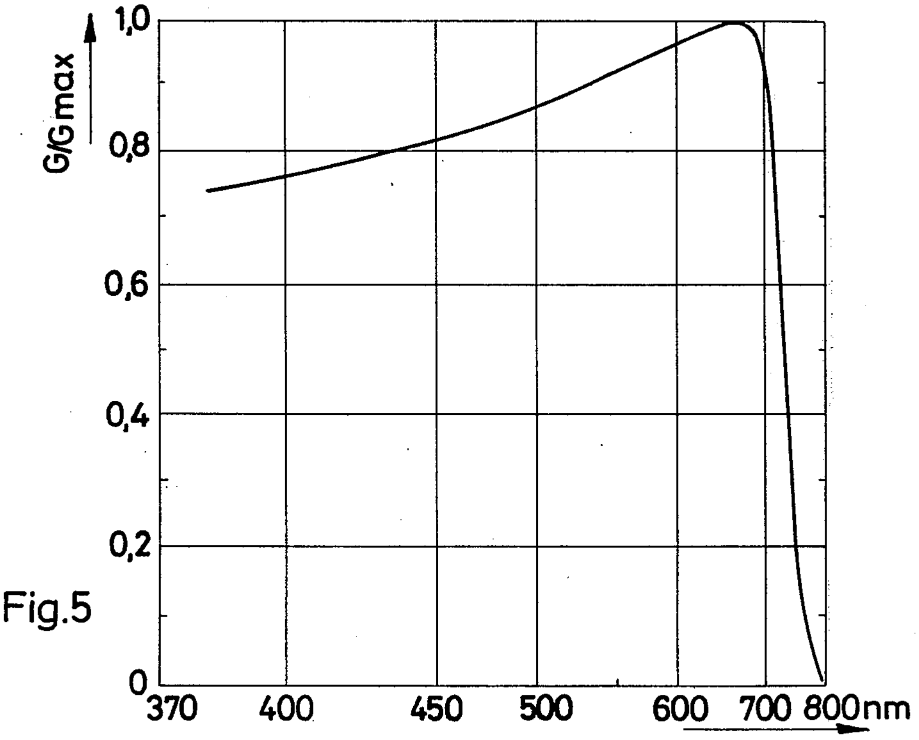
FIG. 5 is a graph depicting the spectral dependence of the sensitivity of the target structure.

The unprecedently high sensitivity of the inventive target structures extends, in particular, into the red spectral region. During testing, we have found that the sensitivity for shorter-wavelength light is often considerably less, and that this must accordingly be improved when the inventive target structures are to be used for color T.V. camera tubes. We have found, in particular, that poor blue sensitivity is attributable to the presence of recombination centers at the interface between the n-type CdSe layer 2 and the transparent signal electrode 1. Because blue light is strongly absorbed in CdSe, optical liberation of charge carriers in the CdSe by blue light occurs in very close proximity to the zone of recombination centers between layers 1 and 2. As a result, these prematurely recombined optically generated charge carriers do not contribute to the passage of current through the target, or more particularly to the control of the potential barrier for beam-injected electrons. In our CdSe targets (e.g., our preferred n-type ZnSe/n-type CdSe targets), we can overcome this difficulty either by spatially separating the blue absorption zone from the aforementioned zone of recombination centers, or alternatively by preventing the formation of the zone of recombination centers. To do this, prior to deposition of photoconductive layer 2, we deposit on the transparent signal electrode 1 an additional semiconductor layer 7 (see FIG. 3) which has a large forbidden energy gap and is transparent for blue light. At present, the preferred material for layer 7 is a ZnSe layer vapor deposited on the signal electrode 1 in vacuum at a thickness of about 5 to 200 nanometers. Thereafter, the photoconductive layer 2 per se is deposited on the layer 7. The excellent uniformity of the spectral response of the resultant target structure is graphically depicted in FIG. 5.

To give an idea of the superiority of our novel phototransistor target structure, relative to comparable prior-art target structures, the results of comparison tests are tabulated below. In these tests, measurements were performed on: our preferred n-type ZnSe/n-type CdSe phototransistor target structure; a conventional $Sb_2S_3$ vidicon target structure of the type in which dark current is reduced not by means of a p-n junction but instead by the use of a porous photoconductive $Sb_2S_3$ layer whose porosity inherently increases effective ohmic resistance; a conventional PbO vidicon (plumbicon) target structure comprising p- and n-type PbO layers forming a p-n junction which minimizes dark current; and a so-called siliconmulti-diode vidicon tube in which a layer of n-type Si is adjoined by a multitude of deposits of p-type silicon to form a multitudinous array of p-n junctions which reduce dark current. The results of these measurements are as follows:

| | antimony trisulfide vidicon | plumbicon | silicon multidiode vidicon | inventive n-ZnSe/ n-CdSe phototransistor vidicon |
|---|---|---|---|---|
| target voltage (volts) | 50 | 45 | 10 | 20 |
| dark current (nanoamperes) | 20 | 3 | 40 | 20 |
| sensitivity to visible light (microamperes per lumen) | 250 | 400 | 800 | 4000 |
| wavelength of maximum spectral sensitivity (nanometers) | 540 | 490 | 770 | 680 |
| range of spectral sensitivity between 75% and 100% of maximum observed gain (nanometers) | 390–520 | 400–560 | 550–900 | 400–720 |
| response build-up (%) | | | | |
| after 60 ms | 80 | 98 | | |
| after 100 ms | | | | 100 |
| after 200 ms | 100 | 100 | | |
| response fade-out (%) | | | | |
| after 60 ms | | | 10 | |
| after 100 ms | 10 | 1.2 | | 10–20 |
| after 400 ms | 2 | 0.6 | | 3–6 |

It will be understood that each of the elements described above, or two or more together, may also find a useful application in other types of constructions and production methods differing from the types described above.

While the invention has been illustrated and described as embodied in a target structure composed of layers of certain materials, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. In a television-camera pick-up tube, a novel target structure which exhibits greater-than-unity amplification (gain), the target structure having one side facing incident scene light and having an opposite side facing a scanning electron beam, the novel target structure comprising, in combination,

- a glass plate (0) on that side of the target structure exposed to scene light;
- a transparent signal electrode (1) on the side of the glass plate facing the electron beam;
- a homogeneous layer (2) of n-type photoconductive semiconductor material on the side of the transparent signal electrode facing the electron beam;
- a homogeneous layer (4) of n-type semiconductor material on the side of the photoconductive layer facing the beam, and having a resistivity greater than $10^8$ ohm-centimeters, the interface (3) between the pair of n-type semiconductor layers being possessed of a multitude of interface states located at energy levels such as to capture both holes optically generated within the n-type photoconductive layer (2) and beam-injected electrons, the interface states being predominently acceptor-level interface states, the edge energy of the valence band of the layer (4) of $10^8$ ohm-centimeter material being at the interface lower than the edge energy of the valence band of the n-type photoconductive layer (2) at the interface (3) to create a potential barrier for holes preventing holes optically generated in the n-type photoconductive layer (2) from crossing the interface (3) to the beam-side of the target structure.

2. In a television-camera pick-up tube, a novel target structure which exhibits greater-than-unity amplification (gain), the target structure having one side facing incident scene light and having an opposite side facing a scanning electron beam, the novel target structure comprising, in combination, a glass plate on that side of the target structure exposed to scene light; a transparent signal electrode on the side of the glass plate facing the electron beam; a pair of layers of material on the side of the transparent signal electrode facing the electron beam, one of the pair of layers being a homogeneous photoconductive semiconductor layer, the other of the pair of layers being a homogeneous layer of non-metallic material having a resistivity greater than $10^8$ ohm-centimeters, the interface between the pair of layers being possessed of a multitude of interface states located at energy levels such as to capture both first-polarity charge carriers optically generated within the photoconductive layer and second-polarity charge carriers injected into the target structure from the side of the interface opposite to that at which the photoconductive layer is located, the edge energy of the conduction band of the homogeneous layer at the light-side of the interface being higher than the edge energy of the conduction band of the homogeneous layer at the beam-side of the interface to create a potential barrier for electrons travelling across the interface in the direction from the beam-side to the light-side of the target structure and thereby cause such electrons to become trapped in the interface states, the edge energy of the valence band of the homogeneous layer at the beam-side of the interface being lower than the edge energy of the valence band of the homogeneous layer at the light-side of the interface to create a potential barrier for holes travelling across the interface in the direction from the light-side to the beam-side of the target structure and thereby cause such holes to become trapped in the interface states, the capture in the interface states of the first-polarity charge carriers optically generated in the photoconductive layer lowering the potential barrier for the passage of the injected second-polarity charge carriers through the interface, so that one optically generated first-polarity charge carrier captured in an interface state by reducing the potential barrier for injected second-polarity charge carriers during its interface entrapment allows more than one injected second-polarity charge carrier to cross the interface, thereby creating greater than unity amplification.

3. In a television-camera pick-up tube, a novel target structure which exhibits greater-than-unity amplification (gain), the target structure having one side facing incident scene light and having an opposite side facing a scanning electron beam, the novel target structure comprising, in combination a glass plate on that side of the target structure exposed to scene light; a transparent signal electrode on the side of the glass plate facing the electron beam; a pair of layers of material on the side of the transparent signal electrode facing the electron beam, one of the pair of layers being a homogeneous photoconductive semiconductor layer, the other of the pair of layers being a homogeneous layer of non-metallic material having a resistivity greater than $10^8$ ohm-centimeters, the interface between the pair of layers being possessed of a multitude of interface states located at energy levels such as to capture both first-polarity charge carriers optically generated within the photoconductive layer and second-polarity charge carriers injected into the target structure from the side of the interface opposite to that at which the photoconductive layer is located, the edge energy of the conduction band of the homogeneous layer at the light-side of the interface being higher than the edge energy of the conduction band of the homogeneous layer at the beam-side of the interface to create a potential barrier for electrons travelling across the interface in the direction from the beam-side to the light-side of the target structure and thereby cause such electrons to become trapped in the interface states, the edge energy of the valence band of the homogeneous layer at the beam-side of the interface being lower than the edge energy of the valence band of the homogeneous layer at the light-side of the interface to create a potential barrier for holes travelling across the interface in the direction from the light-side to the beam-side of the target structure and thereby cause such holes to become trapped in the interface states.

4. In a television pick-up tube as defined in claim 3, the photoconductive layer being located at the light-side of the interface, the non-metallic layer being located at the beam-side of the interface, the first-polarity charge carriers optically generated within the photoconductive layer being optically generated holes, the injected second-polarity charge carriers being electron-beam-injected electrons, the interface states being predominantly acceptor-level interface states.

5. In a television pick-up tube as defined in claim 4, the non-metallic layer being a layer of semiconductor material.

6. In a television pick-up tube as defined in claim 5, the two homogeneous layers being layers of semiconductor material of the same conductivity type.

7. In a television pick-up tube as defined in claim 6, the photoconductive layer being a layer of n-type photoconductive material, the non-metallic layer being a layer of n-type semiconductor material.

8. In a television pick-up tube as defined in claim 4, the photoconductive layer being a layer of n-type CdSe.

9. In a television pick-up tube as defined in claim 8, the non-metallic layer being a layer of one of the materials in the group consisting of zinc selenide, zinc sulfide, arsenic sulfide, antimony sulfide, calcium fluoride, magnesium fluoride, and silicon oxide.

10. In a television pick-up tube as defined in claim 4, the photoconductive layer being a layer of n-type CdSe, the non-metallic layer being a layer of n-type ZnSe.

11. In a television pick-up tube as defined in claim 9, further including between the layer of n-type CdSe and the transparent signal electrode a layer of material having a large forbidden energy gap for increasing the blue sensitivity of the target structure.

12. In a television pick-up tube as defined in claim 11, the material having the large forbidden energy gap being zinc selenide.

* * * * *